(12) United States Patent
Tseng et al.

(10) Patent No.: US 8,922,757 B2
(45) Date of Patent: Dec. 30, 2014

(54) PHOTO-ALINGMENT APPARATUS, AND METHOD FOR FABRICATING LIQUID CRYSTAL DISPLAY

(75) Inventors: Hung-I Tseng, Miao-Li County (TW); Ker-Yih Kao, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 169 days.

(21) Appl. No.: 13/592,823

(22) Filed: Aug. 23, 2012

(65) Prior Publication Data
US 2013/0083307 A1  Apr. 4, 2013

(30) Foreign Application Priority Data
Sep. 30, 2011  (TW) .............................. 100135465 A

(51) Int. Cl.
G02F 1/1337 (2006.01)
G03F 7/20 (2006.01)
H01J 9/24 (2006.01)
G02F 1/13 (2006.01)

(52) U.S. Cl.
CPC ........ *G02F 1/133788* (2013.01); *G03F 7/7035* (2013.01); *G03F 7/70566* (2013.01); *H01J 9/24* (2013.01); *G02F 1/1303* (2013.01); *G03F 7/20* (2013.01)
USPC .................. 355/84; 355/78; 349/94; 349/124

(58) Field of Classification Search
CPC ............ G02F 1/1337; G02F 1/133753; G02F 1/133788; G03F 7/7035; G03F 7/70566
USPC ........ 349/94, 123, 124, 129, 134; 355/67, 71, 355/77, 78, 84
See application file for complete search history.

(56) References Cited

U.S. PATENT DOCUMENTS

| | | | |
|---|---|---|---|
| 6,206,527 B1 * | 3/2001 | Suzuki | 359/858 |
| 2001/0041380 A1 * | 11/2001 | Samant et al. | 438/29 |
| 2010/0035190 A1 | 2/2010 | Jung et al. | |
| 2011/0141406 A1 | 6/2011 | Lin et al. | |
| 2013/0003033 A1 * | 1/2013 | Lee et al. | 355/67 |
| 2013/0100431 A1 * | 4/2013 | Kajiyama et al. | 355/72 |
| 2013/0169917 A1 * | 7/2013 | Mizumura | 349/123 |
| 2013/0230799 A1 * | 9/2013 | Arai et al. | 430/30 |
| 2013/0235362 A1 * | 9/2013 | Kanao | 355/67 |

FOREIGN PATENT DOCUMENTS

TW  201120491  6/2011
WO  WO 2011132620 A1 * 10/2011

OTHER PUBLICATIONS

Taiwanese language office action dated Jan. 15, 2014.
English language translation of abstract of TW 201120491 (published Jun. 16, 2011).

* cited by examiner

*Primary Examiner* — Colin Kreutzer
(74) *Attorney, Agent, or Firm* — McClure, Qualey & Rodack, LLP

(57) ABSTRACT

A photo-alignment apparatus is provided, which includes an exposure machine, at least one mask and a photo-alignment area. The exposure machine includes a light source, a polarization plate, and a multilayer splitter. The light source emits an unpolarized light. The polarization plate receives the unpolarized light and converts the unpolarized light into a polarized light. The multilayer splitter split the polarized light into a first light beam and a second light beam. The mask includes at least two transmission portions which allow the first and second light beams to be transmitted therethrough and be projected onto the photo-alignment area for exposure thereto.

8 Claims, 8 Drawing Sheets ures necessary to accommodate the apparatus, but a longer manufacturing time for fabricating an alignment layer having two alignment directions is needed, which is economically unsatisfactory.

PHOTO-ALINGMENT APPARATUS, AND METHOD FOR FABRICATING LIQUID CRYSTAL DISPLAY

CROSS REFERENCE TO RELATED APPLICATIONS

This Application claims priority of Taiwan Patent Application No. 100135465, filed on Sep. 30, 2011, the entirety of which is incorporated by reference herein

BACKGROUND OF THE INVENTION

1. Field of the Invention

The invention relates to an apparatus for forming an alignment layer of a liquid crystal display and a method for forming an alignment layer, and more particularly, to an apparatus for forming two different alignment directions on one alignment layer by one unitary light source and method for forming two different alignment directions on one alignment layer by one unitary light source.

2. Description of the Related Art

The LCD panel includes a lower substrate having a pixel electrode, an upper substrate having a common electrode, and a liquid crystal layer interposed between the lower and upper substrate. When applying an electric filed between the pixel electrode and the common electrode, an arrangement of liquid crystal molecules of the liquid crystal layer changes. The optical transmittance of the liquid crystal molecules is controlled by the changed arrangement of the liquid crystal molecules to display an image.

Because liquid crystal molecules control is one important factor for improving display quality, an alignment layer is generally configured on the inner surface of the lower substrate or upper substrate to effectively control the pretilt angle of the liquid crystal molecules.

As shown in FIG. 8, in a conventional photo-alignment apparatus, the conveying track 10 carries a substrate 11 which is coated with processing material along a manufacturing direction. However, due to the same incident angle of the light source 17 projected on the substrate 11, only one alignment direction is formed on the surface of the substrate 11 after the substrate 11 is moved through the masks 15 and light sources 17. In order to form two or more than two alignment directions on the substrate 11, the substrate 11 is turned 180 degrees on the central platform 13 of the conveying track 10, and once again moved through the masks 15 and light sources 17.

For the above mentioned photo-alignment apparatus, not only is a larger size of the factory space necessary to accommodate the apparatus, but a longer manufacturing time for fabricating an alignment layer having two alignment directions is needed, which is economically unsatisfactory.

BRIEF SUMMARY OF THE INVENTION

In this regard, the main objective of the present invention is to provide a photo-alignment apparatus which is able to simultaneously perform two different alignment directions on a substrate. The other main objective of the present invention is to provide a photo-alignment apparatus using less factory space and less manufacturing time.

To achieve the above mentioned objectives, in one exemplary embodiment, the photo-alignment apparatus includes an exposure machine, at least one mask, and a photo-alignment area. The exposure machine includes a light source, a polarization plate, and a multilayer splitter. The light source irradiates an unpolarized light. The polarization plate receives the unpolarized light and converts the unpolarized light to a polarized light. The multilayer splitter receives the polarized light and splits the polarized light into a first light beam and a second light beam. The mask includes at least two transmission portions to allow light to pass therethrough, wherein the first light beam and the second light beam pass through the two transmission portions, respectively. The photo-alignment area corresponds to the mask, wherein the first light beam and the second light beam passing through the two different transmission portions are projected on the photo-alignment area.

In one embodiment, the exposure machine includes one reflective plate and two light transport plates. The reflective plate reflects the unpolarized light emitted from the light source toward to the polarization plate, and the polarization plate converts the unpolarized light into an S-polarized light and a P-polarized light, wherein the P-polarized light is projected into the multilayer splitter. The two light transport plates receive the first light beam and the second light beam and change the traveling directions of the first light beam and the second light beam. Note that the P-polarized light is utilized in the embodiment but it is not limited thereto. In the other embodiment, the S-polarized light may be used.

In one embodiment, after leaving the multilayer splitter, the first light beam along a first traveling path consecutively passes through one of the light transport plates and one of the transmission portions of the mask and is projected on the photo-alignment area. After leaving the multilayer splitter, the second light beam along a second traveling path consecutively passes through another light transport plate and another transmission portion and is projected on the photo-alignment area. The first traveling path may equal to the second traveling path. Alternatively, the first traveling path may be different from the second traveling path, if the exposure energy entering the mask is substantially equal. According to different demands, the shape of the mask can be adjusted to change the light incident direction and light intensity.

In one embodiment, the photo-alignment apparatus further includes a conveying track capable of conveying a substrate, wherein the substrate is conveyed along a manufacturing direction to move through the photo-alignment area, wherein the transmission portions of the mask have a predetermined width in the manufacturing direction, wherein the predetermined width is dependant upon the summation of the exposure energy in which the photo-alignment area receives. Therefore, the transmission portions of the two mask parts may have different widths.

The invention further provides a method for forming an alignment layer, which includes: providing a substrate which is coated with a photosensitive material; providing a light source to produce an unpolarized light; converting the unpolarized light to a polarized light; splitting the polarized light into a first light beam and a second light beam; and providing at least one mask disposed above the substrate to define the light distribution shape of the first and second light beams projected onto the photosensitive material; and having the first and second light beams pass through the mask to expose the photosensitive material to the first and second light beams.

To move the substrate through the area where the first and second light beams are projected, the above mentioned method further includes providing a conveying track to move the substrate along a manufacturing direction, wherein a transmission portion of the mask has a predetermined width in the manufacturing direction, and by changing the predetermined width of the transmission portion, a summation of the exposure energy of the first and second light beams projected onto the photosensitive material can be changed.

In one embodiment, the above mentioned method further includes providing two light transport plates to receive the first and second light beams and to change the traveling directions of the first and second light beams, respectively.

The invention further provides a method for fabricating a liquid crystal display module, which includes providing two substrates which has been exposed to the first and second light beams, wherein the photosensitive material on the substrates are photoaligned; disposing a liquid crystal layer between the two substrates and bounding the two substrates to form a liquid crystal panel; and providing a backlight module disposed adjacently to the liquid crystal panel. Thus, the liquid crystal molecules near the alignment layer are pretilted at a pretilt angle.

The photo-alignment apparatus of the present invention utilizes a multilayer splitter to split a unitary light source into a first light beam and a second light beam, which have substantially equal intensity. Because the first light beam and a second light beam are projected on the substrate which is coated with photosensitive material at different incident angles, two different alignment directions are simultaneously formed on the photosensitive material, so that manufacturing time is reduced remarkably.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
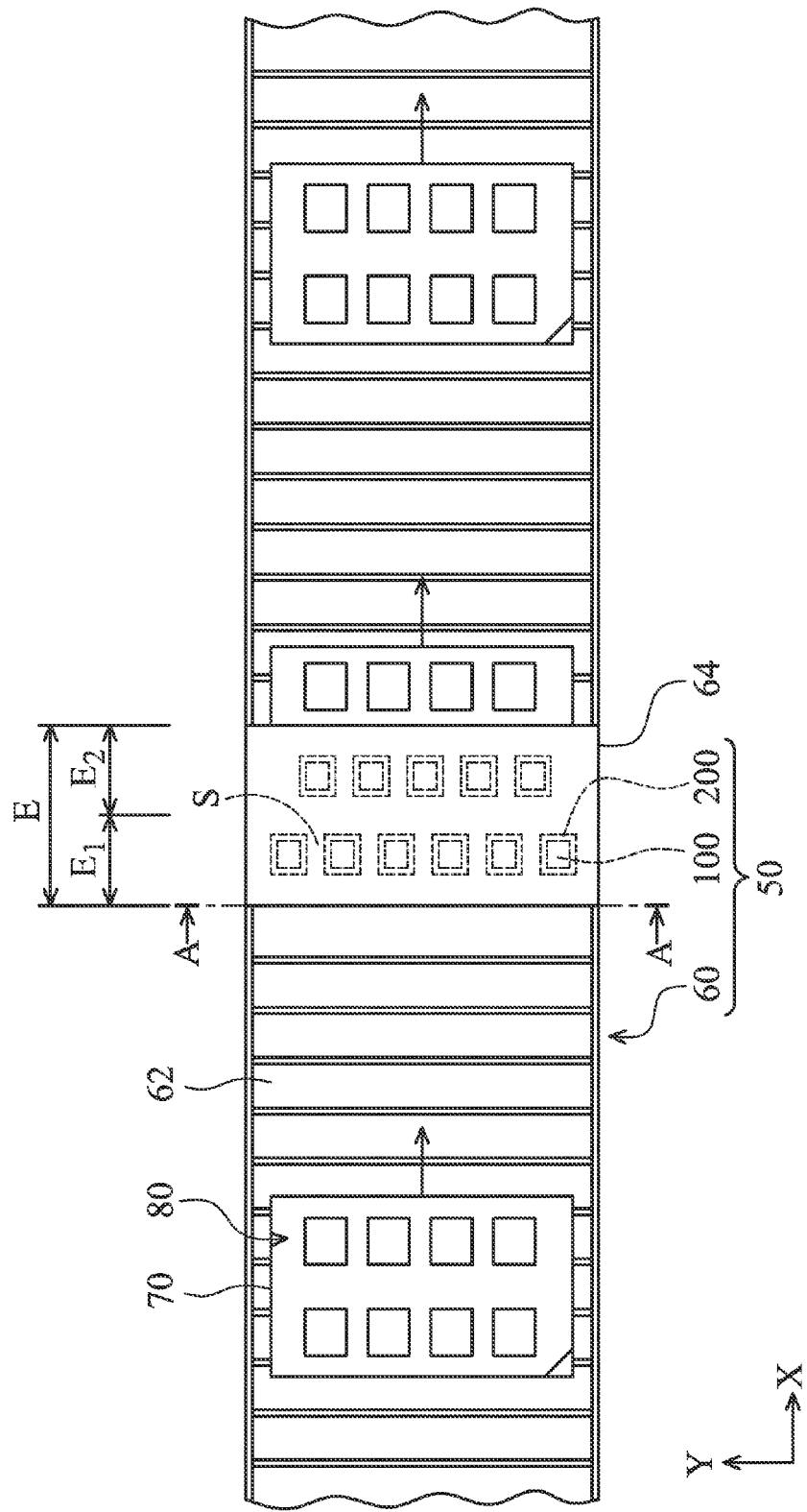
FIG. 1 shows a top plan view of a photo-alignment apparatus with substrates thereon in accordance with a preferred embodiment of the present invention.
Figure 2:
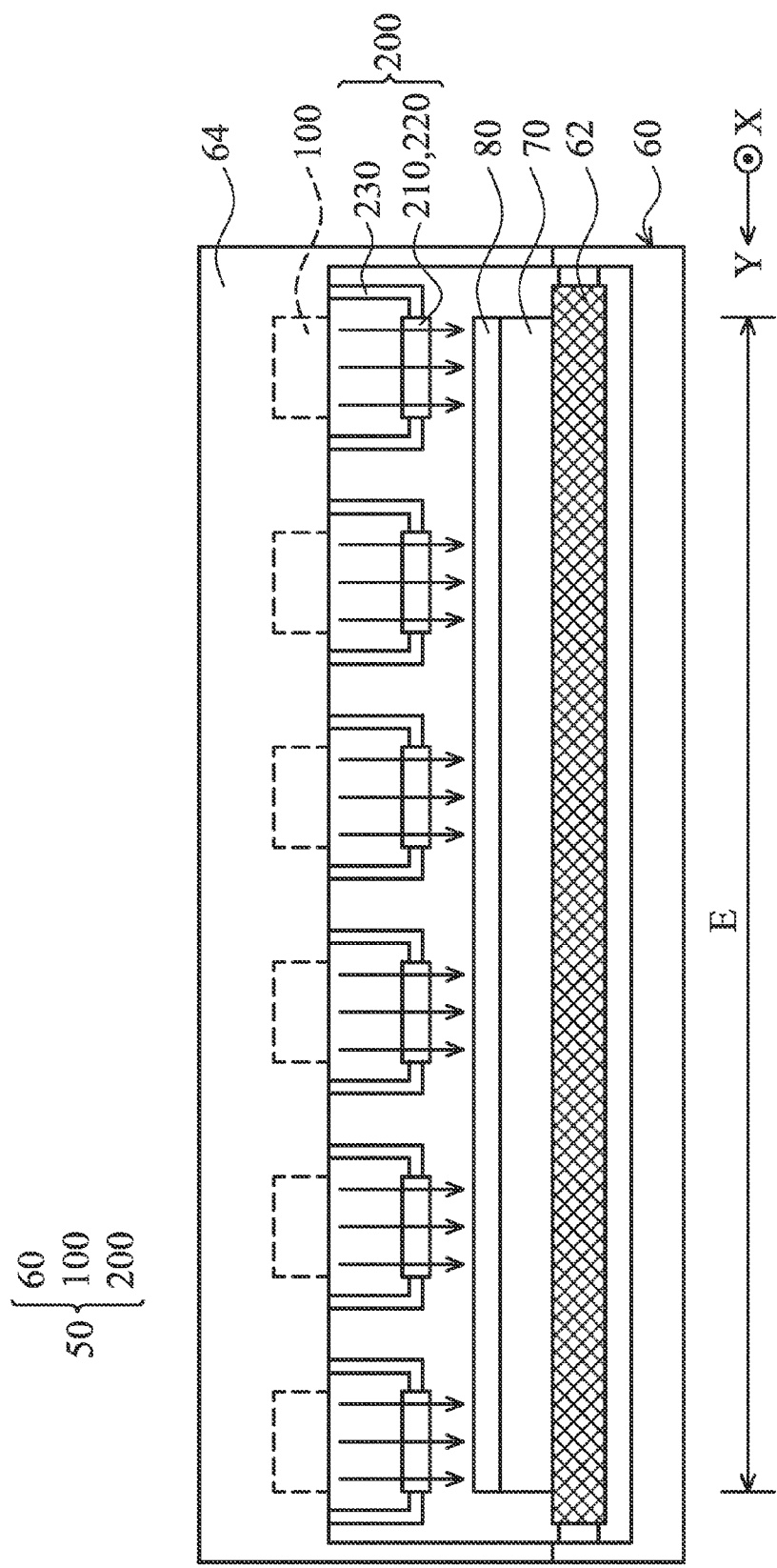
FIG. 2 shows a side view showing the A-A section observed along the X direction in FIG. 1.

Please refer to FIGS. 1 and 2, in which FIG. 2 shows a side view showing the A-A section observed along the X direction in FIG. 1 in accordance with the exemplary embodiment of the present invention, wherein only one exposure machine 100 and partial masks 200 which are set in a first photo-alignment area E1 are shown in FIG. 2 for simplification. In one exemplary embodiment, the photo-alignment apparatus 50 includes a conveying track 60, a plurality of exposure machines 100, and a plurality of masks 200.

The conveying track 60 includes a conveying belt 62, a frame body 64, and a photo-alignment area E, wherein the conveying belt 62 is capable of conveying a plurality of large-sized substrates having 2500 millimeter in width along a manufacturing direction (X-direction). The frame body 64 corresponds to a portion of conveying belt 62 and is disposed thereabove for allowing the exposure machine 100 and the masks 200 to be installed therein. The photo-alignment area E is defined at an area of the surface of the conveying belt 62 which is below the exposure machine 100 and the masks 200. Being conveyed along the manufacturing direction (X-direction), the substrates 70 pass through a first photo-alignment area E1 and a second photo-alignment area E2 orderly.

In one exemplary embodiment, the photo-alignment apparatus 50 includes eleven exposure machines 100, wherein six of the exposure machines 100 are corresponding to the first photo-alignment area E1 and disposed inside the frame body 64, and the other 5 exposure machines 100 are corresponding to the second photo-alignment area E2 and disposed inside the frame body 64. Specifically, the exposure machines 100 in the first photo-alignment area E1 are disposed inside the frame body 64 along a predetermined direction (Y-direction), wherein the exposure machines 100 are spaced apart from one another by a space S, and the exposure machines 100 in the second photo-alignment area E2 respectively corresponds to one of the spaces S and are disposed inside the frame body 64 along a predetermined direction (Y-direction). In other embodiments, the number of the exposure machines 100 can be changed as desired. For example, the number of the exposure machines 100 can be changed according to the number of the substrates simultaneously exposed thereto or the specification of the photo-alignment apparatus 50.

Figure 3:
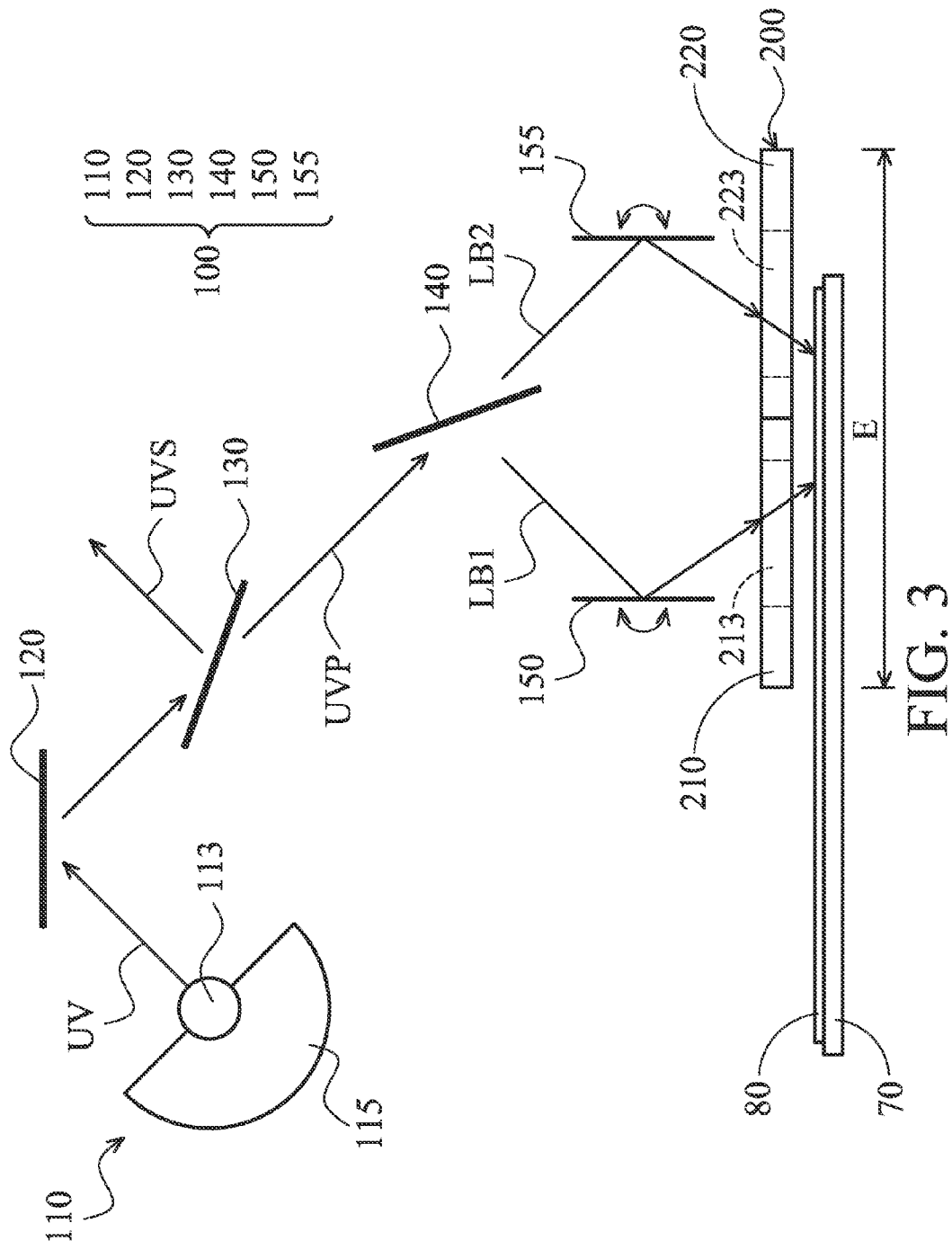
FIG. 3 shows a schematic view of the photo-alignment apparatus in accordance with the preferred embodiment of the present invention while photo-aligning an alignment layer.

Please refer to FIG. 3, wherein each of the exposures 100 includes a light source 110, a reflective plate 120, a polarization plate 130, a multilayer splitter 140, and two light transport plates 150 and 155. The light source 110 includes a lamp 113 and a reflective cover 115. The lamp 113 is configured to irradiate unpolarized light UV (such as ultraviolet light in the embodiment). The reflective cover 115 is configured to reflect or to converge the unpolarized light UV emitted from the lamp 113 to the reflective plate 120. In one exemplary embodiment, the light source 110 of the exposure machine 100 is a unitary light source. It is noted that "unitary" should not be narrowly construed as being limited to the number of light source 110 or light emitting elements inside the light source 110, but "unitary" should be broadly defined as the traveling direction of the light produced by the light source 110. For example, the arrow shown in FIG. 3 indicates that the unpolarized light UV from the light source 110 is generally projected to the reflective plate 120 along a unitary direction.

The reflective plate 120 is configured to reflect the unpolarized light UV emitted from the light source 110 toward to the polarization plate 130. The polarization plate 130 receives the unpolarized light UV and converts the unpolarized light UV to a polarized light, in which the polarized light includes an S-polarized light UVS and a P-polarized light UVP. Specifically, because the polarization plate 130 is stacked by a plurality of layers which have different index of refractions, while the light from the reflective plate 120 is projected into the polarization plate 130 at a particular angle, such as a Brewster angle, the S-polarized light UVS is totally reflected by the polarization plate 130, and the P-polarized light UVP is able to pass through the polarization plate 130.

In one exemplary embodiment, when the P-polarized light UVP from the polarization plate 130 is projected to the multilayer splitter 140, the P-polarized light UVP is equally split into a first light beam LB1 and a second light beam LB2, wherein the first light beam LB1 is reflected by the multilayer splitter 140, and the second light beam LB2 passes through the multilayer splitter 140.

The two light transport plates 150 and 155 are disposed at two opposite sides of the multilayer splitter 140 to reflect the first light beam LB1 and the second light beam LB2, respectively. The arranged angles of the two light transport plates 150 and 155 can be adjusted as desired to change the traveling direction of the first light beam LB1 and the second light beam LB2, so that the first light beam LB1 and the second light beam LB2 can be guided to the photo-alignment area E on the conveying track 60 at a particular angle. Moreover, the arranged angles and positions of the two light transport plates 150 and 155 can be adjusted according to the shape of the masks 200, the arranged angle of the masks 200, or the desired light traveling path.

Figure 4:
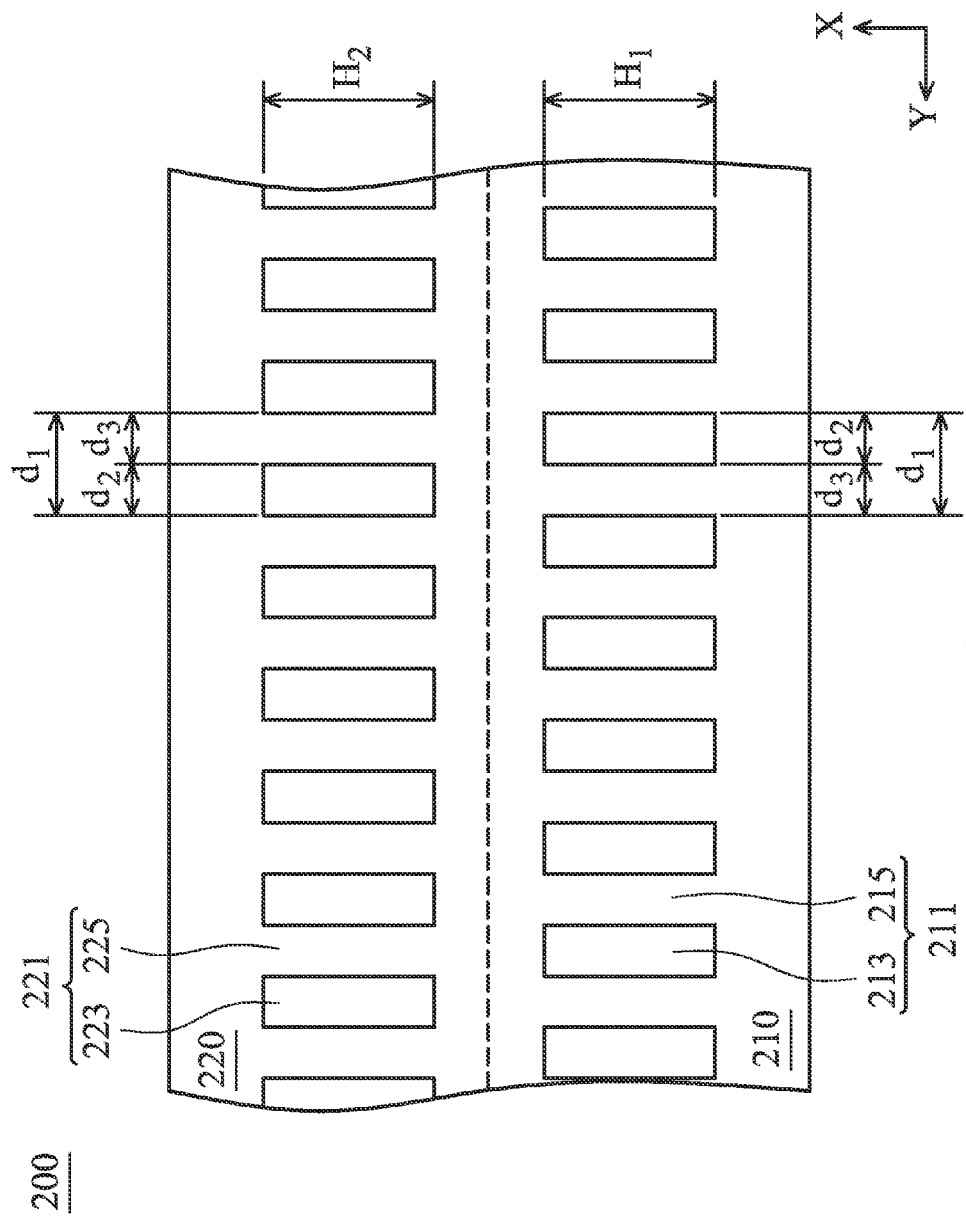
FIG. 4 shows a partial top plan view of a mask in accordance with the preferred embodiment of the present invention.

Please refer to FIGS. 2 and 4. Each of the masks 200 respectively includes a first mask part 210, a second mask part 220, and a holder 230. Corresponding to the position where each of the exposure machines 100 is disposed, the holders 230 are connected to the frame body 64, so that the first and second mask parts 210 and 220 are disposed between the exposure machine 100 and the conveying track 60.

Please refer to FIG. 4, which shows a partial magnified view of one of the masks 200 of the exemplary embodiment of the present invention. The first mask part 210 extends along the predetermined direction (Y-direction) and includes a plurality of exposure units 211 consecutively arranged in the predetermined direction (Y-direction). Each of the plurality of exposure units 211 respectively includes a transmission portion 213 to allow light to pass therethrough and a blocking portion 215 to block light, wherein the transmission portion 213 and the blocking portion 215 are arranged in the predetermined direction (Y-direction) orderly. In other words, the transmission portion 213 and the blocking portion 215 are arranged alternatively on the first mask part 210.

In the predetermined direction (Y-direction), each of the plurality of exposure units 211 has a length $d_1$. Each of the transmission portions 213 and each of the blocking portions 215 has a length $d_2$ and a length $d_3$ in the predetermined direction (Y-direction) and has a width $H_1$ in the manufacturing direction (X-direction). In one exemplary embodiment, the length $d_1$ equals the length of one pixel such, and the length $d_2$ is greater than or equal to the length of half pixel, wherein the length $d_2$ is greater than or equal to the length $d_3$ (i.e. 0 µm<=Δd<=5 µm, where Δd is a difference between the length $d_2$ and the length $d_3$). The size of the width H1 is determined by the summation of the desired exposure energy, which will be described in detail later.

Note that the number of the transmission portions 213 and the blocking portions 215 of each of the plurality of exposure units 211 should not be limited to the above embodiment. Each of exposure units 211 may have two or more than two transmission portions 213 and two or more than two blocking portions 215, wherein the number of the transmission portions 213 and the number of the blocking portions 215 may be different. For example, in the other embodiment (not shown in the drawings), each of the plurality of exposure units 211 has two transmission portions 213 and two blocking portions 215, wherein the transmission portions 213 and the blocking portions 215 are alternatively arranged on the first mask part 210, and each of the transmission portions 213 has a length $d_2$, and the blocking portions 215 has a length $d_3$. The length $d_2$ is greater than or equal to the length $d_3$ (i.e. 0 µm<=Δd<=5 µm, where Δd is a difference between the length $d_2$ and the length $d_3$).

Similarly, the second mask part 220 has a plurality of exposure units 221 and each of the plurality of exposure units 221 respectively has a transmission portion 223 and a blocking portion 225. The description of the plurality of exposure units 221 on the second mask part 220 is omitted here since it is similar to the plurality of exposure units 211 of the first mask part 210 for simplification. It is noted that, however, in the manufacturing direction (X-direction), the transmission portion 223 of the exposure unit 221 and the blocking portion 215 of the exposure unit 215 may be arranged in the same line. That is, they are overlapped to each other in the manufacturing direction (X-direction). In addition, the exposure portions 223 and the blocking portions 225 of each of the plurality of exposure units have a width $H_2$.

Figure 6:
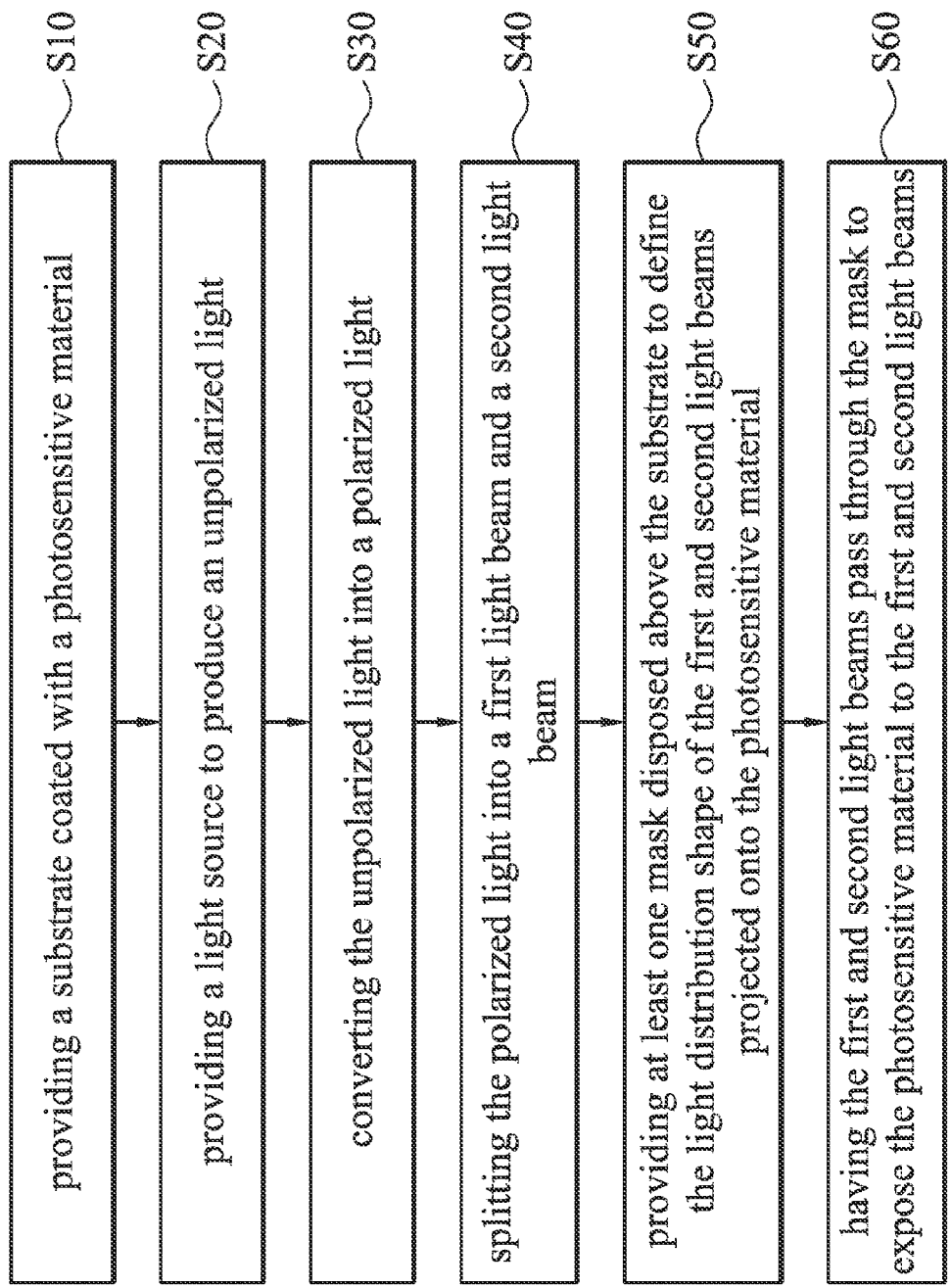
FIG. 6 shows a flowchart describing an exemplary embodiment of a method of manufacturing an alignment layer in accordance with the preferred embodiment of the present invention.

The method for manufacturing an alignment layer is described in detail. Please refer to FIGS. 1, 3 and 6, wherein the FIG. 6 shows the flowchart describing an exemplary embodiment of a method of manufacturing an alignment layer. Firstly, a photosensitive material 80 is applied on the substrate 70 (FIG. 1, S10), wherein the photosensitive material 80 is applied on the surface which will be inject liquid crystal molecules later. Next, a light source 110 is provided to produce an unpolarized light UV (FIG. 3, S20), and a polarization plate 130 is provided to split the unpolarized light UV into an S-polarized light UVS and a P-polarized light UVP (FIG. 3, S30). A multilayer splitter 140 is provided to split the P-polarized light UVP into a first light beam LB 1 and a second light beam LB2 (FIG. 3, S40). Last, the photosensitive material 80 is projected by the first light beam LB1 and the second light beam LB2 (FIG. 3, S50).

Figure 5:
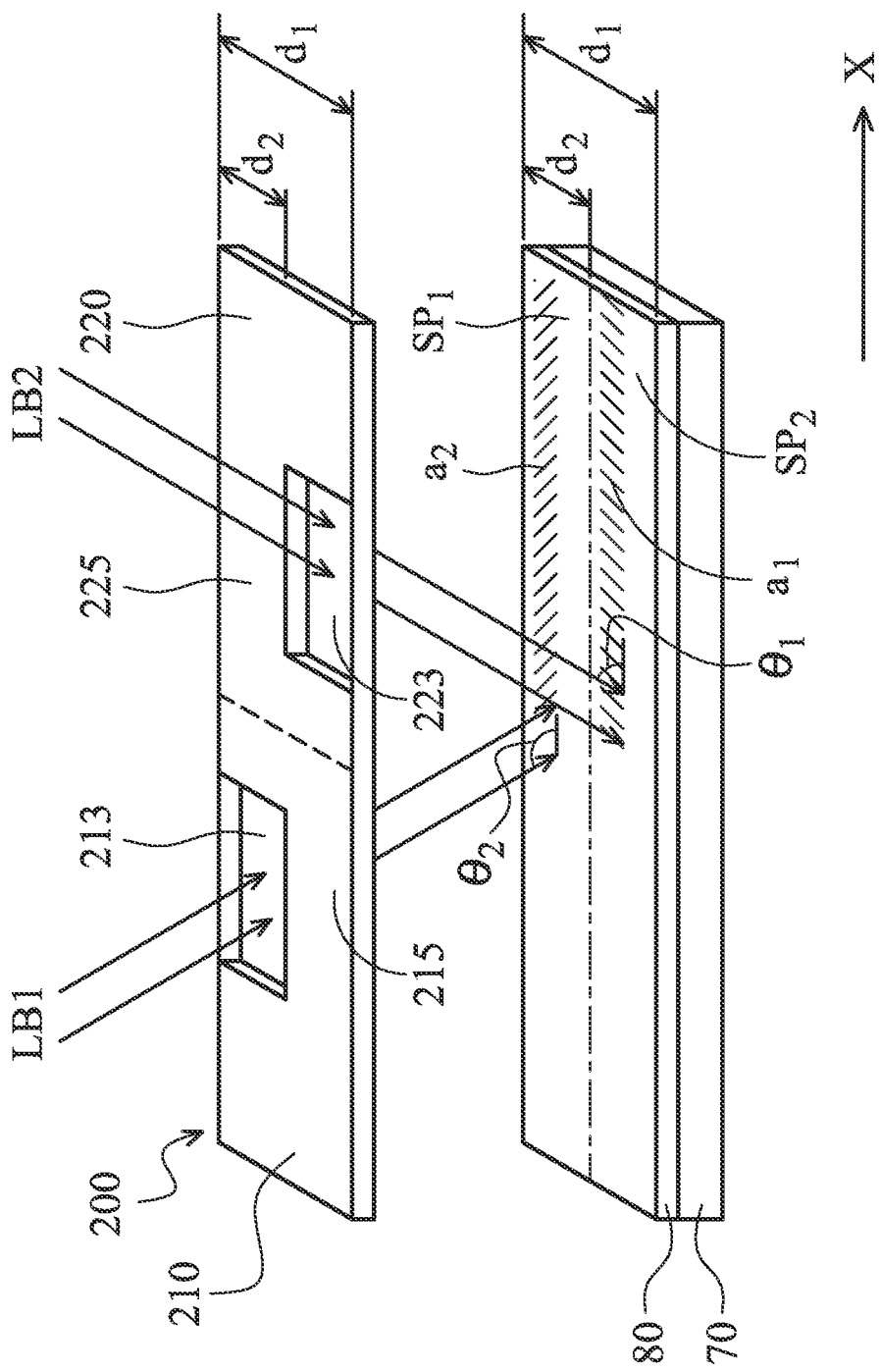
FIG. 5 shows a schematic view illustrating a process of photo-aligning on the alignment layer in accordance with the preferred embodiment of the present invention.

Please refer to FIG. 5, which shows a schematic view illustrating a process of photo-aligning on the alignment layer. The substrate 70 has a first sub-pixel area $SP_1$ and a second sub-pixel area SP2 adjacent to the first sub-pixel area $SP_1$. When the substrate 70 is conveyed along the manufacturing direction (X-direction), the first light beam LB1, passing through the transmission portion 213 of the first mask part 210, is projected on the first sub-pixel area $SP_1$ of the substrate 70, such that a first photo-alignment direction $a_1$ is formed on the surface of the first sub-pixel area $SP_1$. On the other hand, the second light beam LB2, passing through the transmission portion 223 of the second mask part 220, is projected on the second sub-pixel area $SP_2$ of the substrate 70, such that a second photo-alignment direction $a_2$ is formed on the surface of the second sub-pixel area $SP_2$. In the embodiment, the first light beam LB1 is projected on the photosensitive material 80 at a first incident angle $\theta_1$ relative to the manufacturing direction (X-direction), and the second light beam LB2 is projected on the photosensitive material 80 at a second incident angle $\theta_2$ relative to the manufacturing direction (X-direction), wherein the first incident angle $\theta_1$ is smaller than 90 degrees and the second incident angle $\theta_2$ is larger than 90 degrees. Consequently, the photosensitive material (alignment layer) 80 exposed to the first light beam LB1 and the second light beam LB2 includes two substantially opposite photo-alignment directions $a_1$ and $a_2$.

Please refer to FIG. 3. Because the photosensitive material 80 is exposed to the first light beam LB1 and the second light beam LB2 which is split from a unitary P-polarized light UVP, a different energy intensity between the first light beam LB1 and the second light beam LB2 may occur. To prevent this situation from occurring, the traveling path of the first light beam LB1 and the second light beam LB2, prior to their approaching on the substrate 70, may be adjusted to be substantially equal. Specifically, after passing through the multilayer splitter 140, the first light beam LB1 along a first traveling path consecutively passes through the light transport plate 150 and the transmission portion 213 of the first mask part 210 and is projected to the photosensitive material 80. On the other hand, after passing through the multilayer splitter 140, the second light beam LB2 along a second traveling path consecutively passes through the light transport plate 155 and the transmission portion 223 of the second mask part 220 and is projected to the photosensitive material 80. The first traveling path may be as same as the second traveling path.

Alternatively, the first traveling path may be different from the second traveling path, but the arranged position of the masks 200 or arranged angle of the masks 200 or the shape of the masks 200 may be corporately adjusted to meet the requirement of a photo-alignment process. For example, please refer to FIGS. 4 and 5, wherein according to the energy intensity of the first light beam LB1 and the second light beam LB2, the width $H_1$ of the transmission portion 213 and the width $H_2$ of the transmission portion 223 can be correspondingly modified by a designer. Specifically, if the energy intensity of the first light beam LB1 is smaller than that of the second light beam LB2, the width $H_1$ may be larger than the width $H_2$, so that the first sub-pixel area $SP_1$ and the second sub-pixel area $SP_2$ may receive substantially equivalent summation of the exposure energy.

In addition, through modifying the constitution of the material of the multilayer splitter 140 (FIG. 3), the arranged angle of the two light transport plates 150 and 155 (FIG. 3), or the conveying speed of the substrate 70 on the conveying track 60 (FIG. 1), the summation of the exposure energy projected on the photosensitive material 80 by the first light beam LB1 and the second light beam LB2 may be changed.

Figure 7:
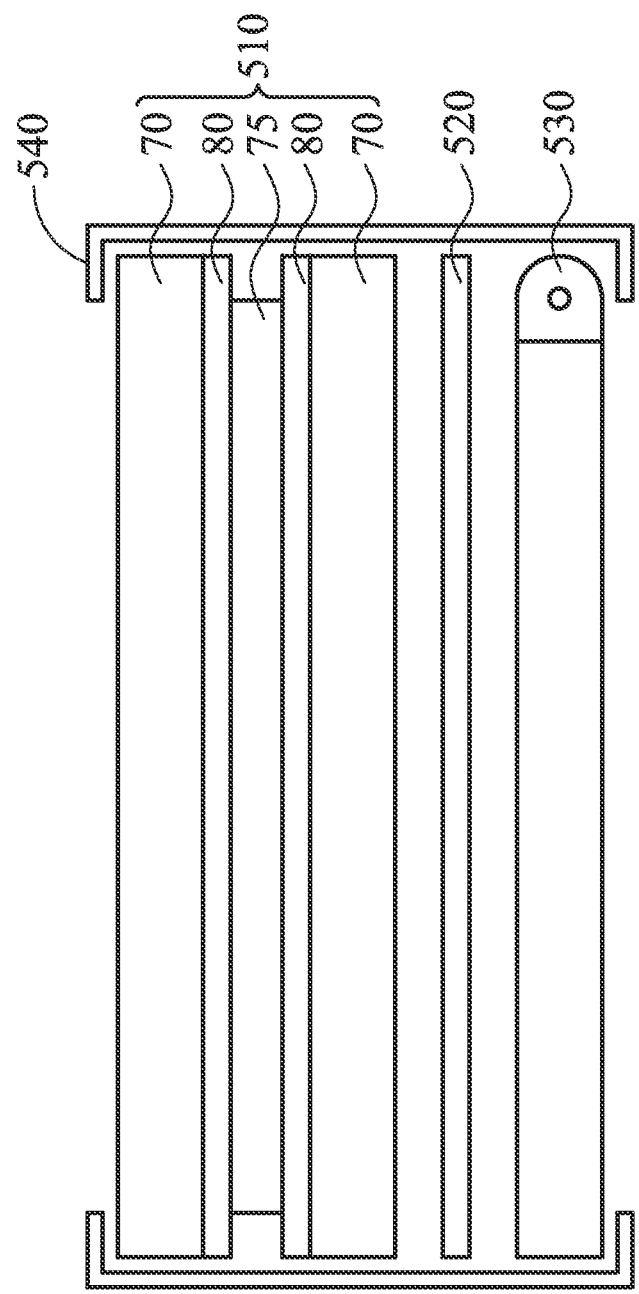
FIG. 7 shows an exploded view of elements of the liquid crystal display device in accordance with the preferred embodiment of the present invention.
Figure 8:
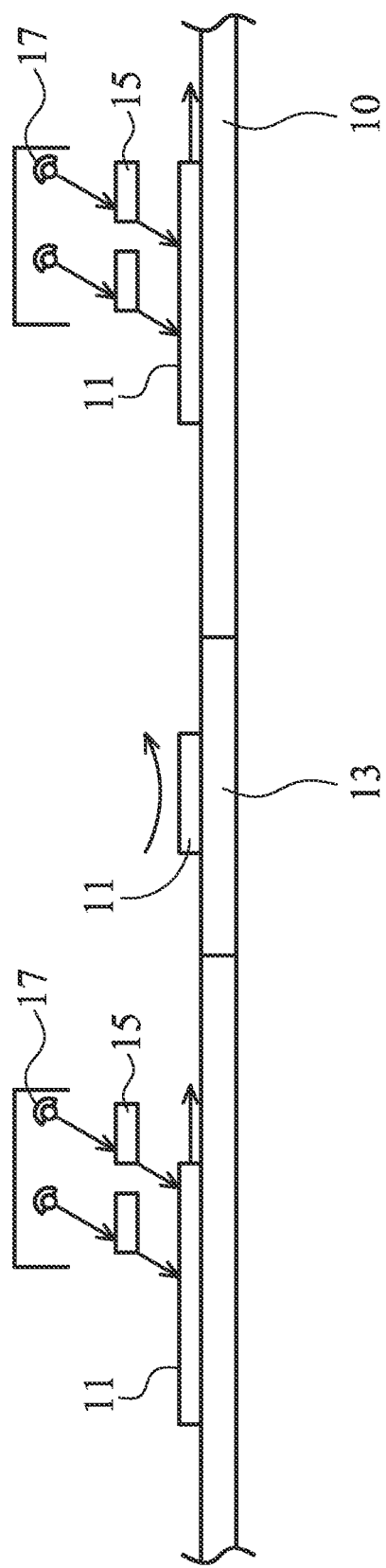
FIG. 8 shows a schematic view of a conventional photo-alignment apparatus.

Please refer to FIG. 7, which shows an exploded view of elements of the liquid crystal display device 500 of the exemplary embodiment of the present invention. The liquid crystal display device 500 includes a liquid crystal panel 510, at least one optical film 520, a backlight module 530, and a frame 540. The at least one optical film 520 is disposed above the backlight module 530. The liquid crystal panel 510 is disposed above the at least one optical film 520 and includes two base plates 70 and a liquid crystal layer 75, wherein the two base plates 70 are configured with two photo-aligned alignment layers 80. The frame 540 surrounds the liquid crystal panel 510, the at least one optical film 520 and the backlight module 530 to fix all of them therein. In a method for manufacturing the liquid crystal display device 500, the liquid crystal layer 75 is firstly disposed on a side of the base plate 70 which is configured with the alignment layer 80. A side of another substrate 70 which is configured with the alignment layer 80 is disposed on the liquid crystal layer 75 so that the liquid crystal layer 75 is sandwiched between the two substrates 70. The two substrates 70 are bounded together to form the liquid crystal panel 510. The at least one optical film 520 and the backlight module 530 are provided to be adjacently disposed on the light incident surface of the liquid crystal panel 510. The frame 540 is provided to fix the liquid crystal panel 510, the at least one optical film 520, and the backlight module 530 therein.

The photo-alignment apparatus of the alignment layer of the present invention is able to simultaneously form two different alignment directions by a unitary light source, which may reduce manufacturing time, and the installed floor area of the plant, so that the manufacturing cost can be reduced.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A photo-alignment apparatus, comprising:
   an exposure machine, comprising;
   a light source, irradiating an unpolarized light;
   a polarization plate, receiving the unpolarized light and converting the unpolarized light to a polarized light;
   a multilayer splitter, receiving the polarized light and splitting the polarized light into a first light beam and a second light beam, wherein the first light beam and the second light beam have the same polarized state; and
   two light transport plates, arranged to be tilted to change the traveling directions of the first light beam and the second light beam respectively;
   at least one mask, comprising at least two transmission portions to allow light to pass therethrough, wherein the first light beam and the second light beam pass through the two transmission portions, respectively, and
   a photo-alignment area, corresponding to the mask, wherein the first light beam and the second light beam passing through the two transmission portions are projected on the photo-alignment area.

2. The photo-alignment apparatus as claimed in claim 1, wherein the exposure machine further comprises a reflective plate to reflect the unpolarized light emitted from the light source toward the polarization plate.

3. The photo-alignment apparatus as claimed in claim 1, wherein the polarization plate converts the unpolarized light into a P-polarized light and an S-polarized light, wherein the P-polarized light is projected into the multilayer splitter.

4. The photo-alignment apparatus as claimed in claim 1, wherein the mask comprises:
   a first mask part, comprising at least one transmission portion; and
   a second mask part, adjacent to the first mask part and comprising at least one transmission portion,
   wherein the first light beam passes through the transmission portion of the first mask part and the second light beam passes through the transmission portion of the second mask part.

5. The photo-alignment apparatus as claimed in claim 4, wherein the number of the transmission portions in both the first mask part and the second mask part is greater than one, and the transmission portions are arranged along a predetermined direction.

6. The photo-alignment apparatus as claimed in claim 1, further comprising a conveying track capable of conveying a substrate, wherein the substrate is conveyed along a manufacturing direction by the conveying track to move through the photo-alignment area, and the transmission portion, allowing the first light beam to pass therethrough, has a first width in the manufacturing direction, and the transmission portion, allowing the second light beam to pass therethrough, has a second width in the manufacturing direction, wherein the first width is different from the second width.

7. A method for fabricating a liquid crystal display module, comprising:
   providing two substrates which are coated with photosensitive material;
   providing a light source to produce an unpolarized light;

converting the unpolarized light to a polarized light;
splitting the polarized light into a first light beam and a second light beam, wherein the first and second light beams have the same polarized state;
providing two light transport plates to receive the first and second light beams and respectively change the traveling directions of the first and second light beams by adjusting tilt angles of the two light transport plates;
providing at least one mask disposed above the two substrates to define the light distribution shape of the first and second light beams projected onto the photosensitive material;
having the first and second light beams pass through the mask to expose the photosensitive material to the first and second light beams;
disposing a liquid crystal layer between the two substrates and bounding the two substrates to form a liquid crystal panel; and
providing a backlight module disposed adjacently to the liquid crystal panel.

8. The method for fabricating a liquid crystal display module as claimed in claim 7, further comprising providing a conveying track to move the two substrates along a manufacturing direction and to expose the photosensitive material to the first and second light beams, wherein a transmission portion of the mask has a predetermined width in the manufacturing direction, and by changing the predetermined width of the transmission portion, a summation of the exposure energy of the first and second light beams projected onto the photosensitive material can be changed.

* * * * *